US012598969B2

(12) United States Patent
Liu et al.

(10) Patent No.: US 12,598,969 B2
(45) Date of Patent: Apr. 7, 2026

(54) FLEXIBLE MONOMER FOR SMOOTH POLYMER SURFACE

(71) Applicant: Applied Materials, Inc., Santa Clara, CA (US)

(72) Inventors: Feng Q. Liu, San Jose, CA (US); Xinke Wang, Singapore (SG); Liqi Wu, San Jose, CA (US); Qihao Zhu, Sunnyvale, CA (US); Bhaskar Jyoti Bhuyan, San Jose, CA (US); Mark Saly, Santa Clara, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 481 days.

(21) Appl. No.: 18/216,127

(22) Filed: Jun. 29, 2023

(65) Prior Publication Data

US 2025/0006555 A1 Jan. 2, 2025

(51) Int. Cl.
*H01L 21/768* (2006.01)

(52) U.S. Cl.
CPC .. *H01L 21/76879* (2013.01); *H01L 21/76889* (2013.01)

(58) Field of Classification Search
CPC ......... H01L 21/76879; H01L 21/76889; H01L 21/28518; H01L 21/76843; C08F 222/102; C08F 8/32; C08F 222/385
See application file for complete search history.

(56) References Cited

U.S. PATENT DOCUMENTS

| | | | |
|---|---|---|---|
| 7,960,273 B2 | 6/2011 | Lee et al. | |
| 9,324,620 B2 | 4/2016 | Lin et al. | |
| 11,545,354 B2 | 1/2023 | Bhuyan et al. | |
| 2009/0140429 A1* | 6/2009 | Lee | H01L 21/76873 438/643 |
| 2017/0372919 A1 | 12/2017 | Manna et al. | |
| 2018/0130707 A1* | 5/2018 | Clendenning | H01L 21/28 |
| 2018/0233350 A1 | 8/2018 | Tois et al. | |
| 2020/0105515 A1 | 4/2020 | Maes et al. | |
| 2021/0384035 A1 | 12/2021 | Fisher et al. | |
| 2022/0252981 A1* | 8/2022 | Deng | G03F 7/0045 |

OTHER PUBLICATIONS

U.S. Appl. No. 17/824,889, filed May 25, 2022, 38 pages.

(Continued)

*Primary Examiner* — Julia Slutsker
(74) *Attorney, Agent, or Firm* — Servilla Whitney LLC

(57) ABSTRACT

Embodiments of the disclosure relate to methods of selectively depositing a metal after use of a flowable polymer to protect a substrate surface within a feature. A first metal layer is deposited by physical vapor deposition (PVD). The semiconductor substrate surface is exposed to one or more monomers to form a flowable and flexible polymer film on the first metal layer within the at least one feature. The flowable polymer film forms on the first metal layer on the bottom. The one or more monomers are selected from one or more of amines with bi-functional groups, aldehydes with bi-functional groups, cyanates with bi-functional groups, ketones with bi-functional groups, and alcohols with bi-functional groups. At least a portion of the first metal layer is selectively removed from the top surface and the at least one sidewall. The flowable polymer film is removed.

20 Claims, 5 Drawing Sheets

(56) References Cited

OTHER PUBLICATIONS

U.S. Appl. No. 18/115,561, filed Feb. 28, 2023, 43 pages.
U.S. Appl. No. 18/142,940, filed May 3, 2023, 58 pages.
U.S. Appl. No. 18/216,286, filed Jun. 29, 2023, 54 pages.
"PCT International Search Report and Written Opinion in PCT/US2024/035324 dated Oct. 11, 2024, 10 pages".

* cited by examiner

FLEXIBLE MONOMER FOR SMOOTH POLYMER SURFACE

TECHNICAL FIELD

Embodiments of the present disclosure pertain to methods of selective deposition facilitated by a flowable polymer. More particularly, embodiments of the disclosure are directed to methods of selectively depositing a metal after use of a flowable polymer to protect a substrate surface within a feature.

BACKGROUND

Gap fill processes are integral to several semiconductor manufacturing processes. A gap fill process can be used to fill a gap (or feature) with an insulating or conducting material. For example, shallow trench isolation, inter-metal dielectric layers, passivation layers, dummy gate, are all typically implemented by gap fill processes.

As device geometries continue to shrink (e.g., critical dimensions <20 nm, <10 nm, and beyond) and thermal budgets are reduced, defect-free filling of spaces becomes increasingly difficult due to the limitations of conventional deposition processes.

Processes for selective tungsten fill have been implemented wherein tungsten can be selectively deposited on a tungsten seed layer. Unfortunately, these processes require a minimum seed layer thickness. Known PVD processes can provide the necessary seed layer thickness, but the selective tungsten fill process will deposit tungsten material on any exposed seed layer. Additionally, there are no known selective metal deposition methods on metal or metal silicide without causing damage to the underlying metal or metal silicide.

Accordingly, there is a need for methods to protect the metal or metal silicide within a feature in order to enable bottom-up fill by selective deposition processes.

SUMMARY

One or more embodiments of the disclosure are directed to a method of forming a semiconductor device. The method comprises: depositing a first metal layer by physical vapor deposition (PVD) on a semiconductor substrate surface with at least one feature formed thereon, the at least one feature having at least one opening having a width, at least one sidewall, and a bottom, the at least one feature extending a feature depth from a top surface to the bottom, the first metal layer forming on the top surface, on the at least one sidewall, and on the bottom; exposing the semiconductor substrate surface to one or more monomers to form a flowable polymer film on the first metal layer within the at least one feature, the flowable polymer film forming on the first metal layer on the bottom, the one or more monomers selected from one or more of amines with bi-functional groups, aldehydes with bi-functional groups, cyanates with bi-functional groups, ketones with bi-functional groups, and alcohols with bi-functional groups; selectively removing at least a portion of the first metal layer from the top surface and the at least one sidewall; and removing the flowable polymer film to expose the first metal layer on the bottom of the at least one feature.

Additional embodiments of the disclosure are directed to a method of manufacturing a semiconductor device. In one or more embodiments, the method comprises: depositing a first metal layer on a substrate surface with at least one feature formed thereon, the at least one feature including at least one opening, at least one sidewall, and a bottom, the at least one feature extending a feature depth from a top surface to the bottom, the first metal layer forming on the top surface, on the at least one sidewall, and on the bottom; exposing the substrate surface to one or more monomers to form a flowable polymer film on the first metal layer within the at least one feature, the flowable polymer film forming on the first metal layer on the bottom, the one or more monomers selected from one or more of amines with bi-functional groups, aldehydes with bi-functional groups, cyanates with bi-functional groups, ketones with bi-functional groups, and alcohols with bi-functional groups; selectively removing the first metal layer from the top surface and from the at least one sidewall; removing the flowable polymer film to expose the first metal layer on the bottom of the at least one feature; and selectively depositing a second metal layer on the first metal layer to fill the at least one feature.

BRIEF DESCRIPTION OF THE DRAWINGS

So that the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The embodiments as described herein are illustrated by way of example and not limitation in the figures of the accompanying drawings in which like references indicate similar elements.

DETAILED DESCRIPTION

Figure 1:
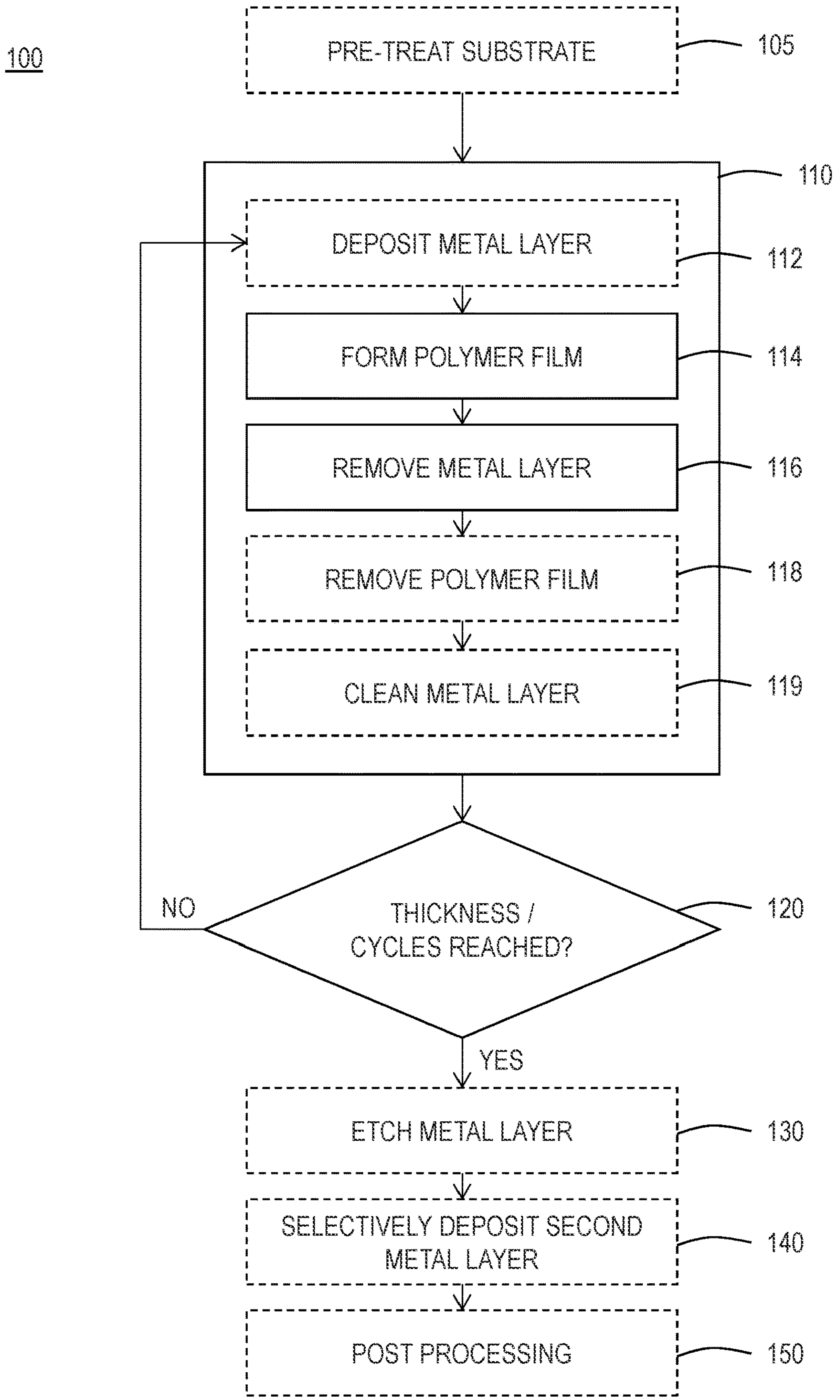
FIG. 1 illustrates a process flow diagram of a method according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of +15% or less, of the numerical value. For example, a value differing by +14%, +10%, +5%, +2%, +1%, +0.5%, or +0.1% would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

As used herein, the term "substrate surface" refers to any substrate surface upon which a layer may be formed. The substrate surface may have one or more features formed therein, one or more layers formed thereon, and combinations thereof. The shape of the feature can be any suitable shape including, but not limited to, peaks, trenches, holes and vias (circular or polygonal). As used in this regard, the term "feature" refers to any intentional surface irregularity. Suitable examples of features include but are not limited to trenches, which have a top, two sidewalls and a bottom extending into the substrate, vias which have one or more sidewall extending into the substrate to a bottom and slot vias.

As used in this specification and the appended claims, the term "selectively" refers to a process which acts on a first surface with a greater effect than another second surface. Such a process would be described as acting "selectively" on the first surface over the second surface. The term "over" used in this regard does not imply a physical orientation of one surface on top of another surface, rather a relationship of the thermodynamic or kinetic properties of the chemical reaction with one surface relative to the other surface.

The term "on" indicates that there is direct contact between elements. The term "directly on" indicates that there is direct contact between elements with no intervening elements.

As used in this specification and the appended claims, the terms "precursor," "reactant," "reactive gas" and the like are used interchangeably to refer to any gaseous species that can react with the substrate surface.

Embodiments of the disclosure advantageously provide methods for selectively depositing a metal after use of a flowable polymer to protect a substrate surface within a feature. One or more embodiments advantageously provide for the removal of a metallic material from the field and sidewalls of a feature without removal of a flowable polymer from the bottom surface of the substrate. The remaining flowable polymer has a smooth surface. Further embodiments advantageously provide methods for selectively depositing a metallic gap fill in a bottom-up fashion.

The embodiments of the disclosure are described by way of the Figures, which illustrate processes and substrates in accordance with one or more embodiments of the disclosure. The processes, schemes, and resulting substrates shown are merely illustrative of the disclosed processes, and the skilled artisan will recognize that the disclosed processes are not limited to the illustrated applications.

Figure 6:
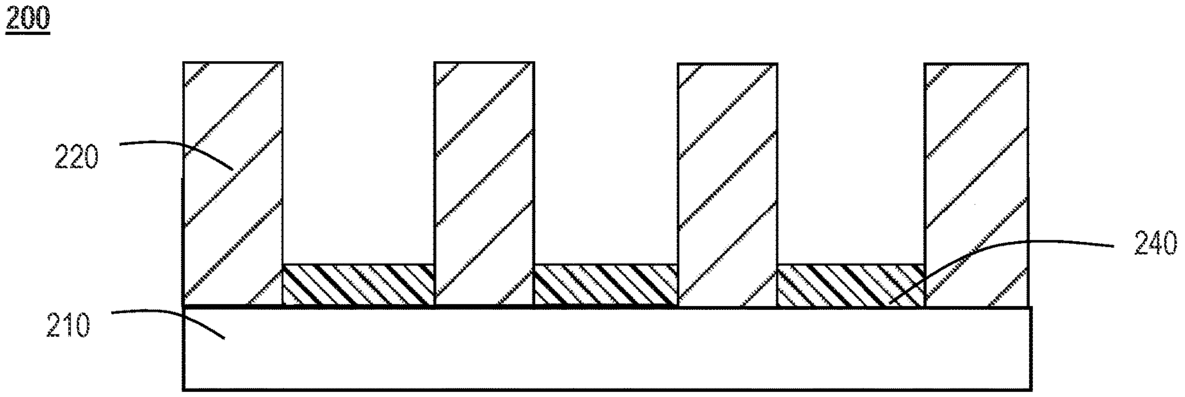
FIG. 6 illustrates a cross-sectional view of a semiconductor substrate according to one or more embodiments.
Figure 7:
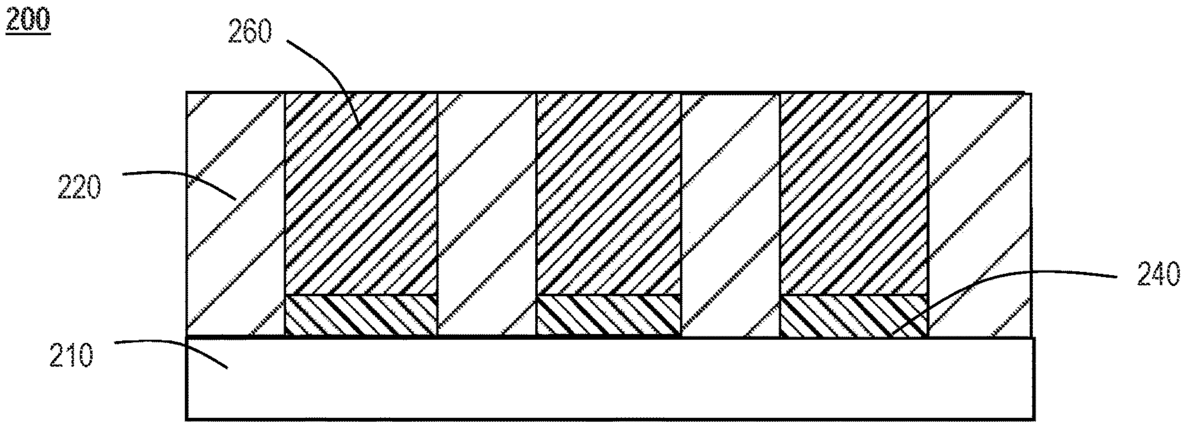
FIG. 7 illustrates a cross-sectional view of a semiconductor substrate according to one or more embodiments.
Figure 8:
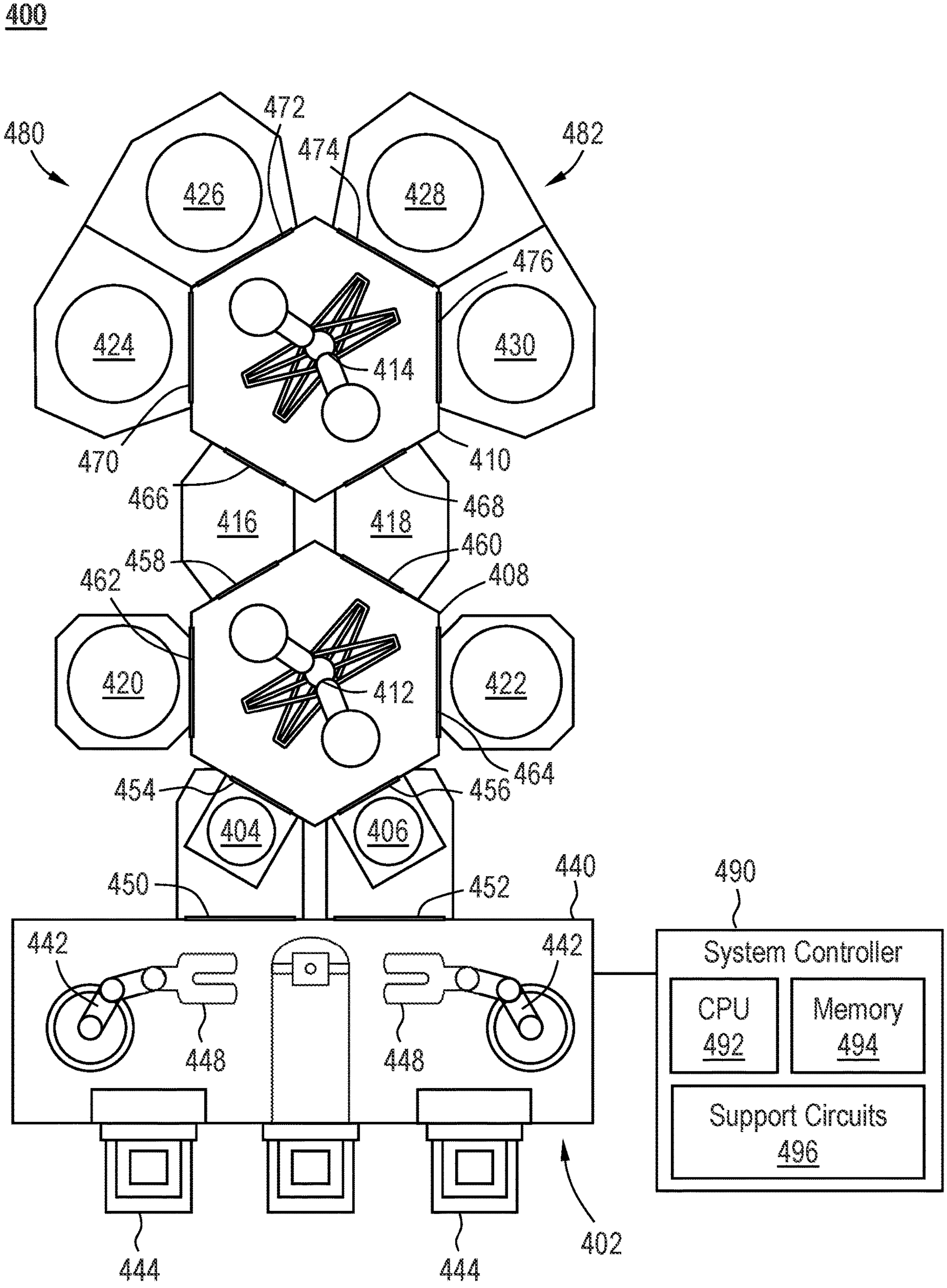
FIG. 8 is a schematic top-view diagram of an example multi-chamber processing system according to one or more embodiments.

Referring to the Figures, the disclosure relates to a method 100 of selective deposition of a gap fill material. FIG. 1 depicts a process flow diagram of a selective deposition method 100 in accordance with one or more embodiments of the present disclosure. FIGS. 2-7 depict a device 200 having a substrate surface with at least one feature formed therein during processing according to one or more embodiments of the present disclosure. FIG. 8 is a schematic top-view diagram of an example multi-chamber processing system for performing the methods according to one or more embodiments.

Figure 2:
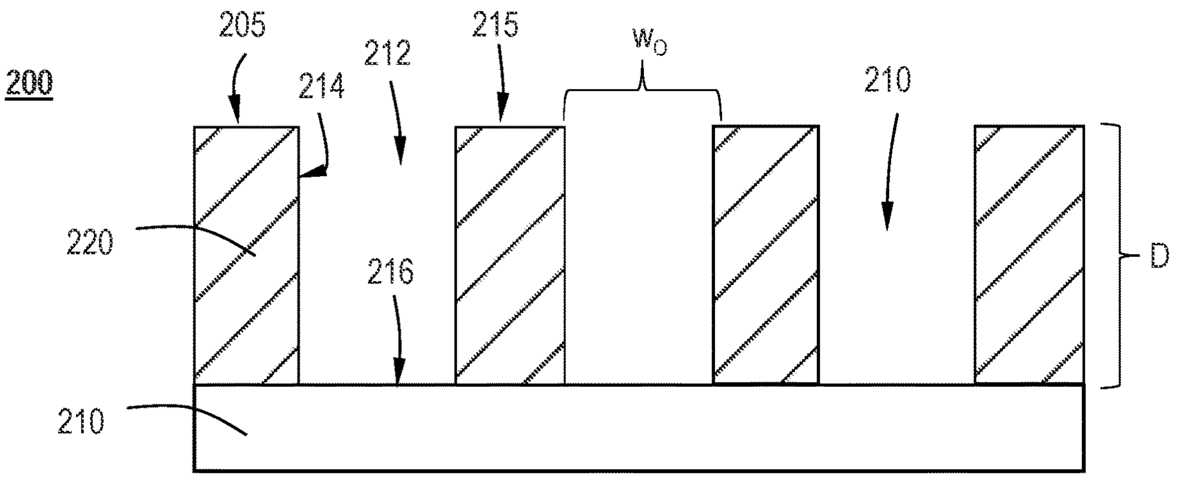
FIG. 2 illustrates a cross-sectional view of a semiconductor substrate according to one or more embodiments.

FIG. 2 illustrates a semiconductor device 200 with a substrate surface 205. As identified above, the substrate surface refers to the exposed surface of the substrate upon which a process may be performed. The substrate surface 205 has at least one feature 210 formed therein. While only three features are shown in the Figures, one skilled in the art will recognize that a plurality of features will each be affected by the disclosed methods in a similar manner.

The at least one feature 210 has an opening 212 with an opening width $w_o$. The opening 212 is formed in a top surface 215 of the device 200. The feature 210 also has one or more sidewall 214 and extends a feature depth D from the top surface 215 to bottom 216. While straight, vertical sidewalls are shown in the Figures, the disclosed methods may also be performed on slanted, irregular, or reentrant sidewalls.

In one or more embodiments, the device 200 illustrated in FIG. 2 is comprised of a material 220 on a material 210. Those skilled in the art will recognize that the top surface 215, sidewall 214, and bottom 216 may each be comprised of one or more similar or different materials. For example, the lower portion of sidewall 214 may be formed from a first material while the upper portion of the same sidewall 214 may be comprised of a second material. Similarly, a thin layer may be deposited on the top surface 215 without forming an appreciable portion of the sidewall 214. In one or more embodiments, the bottom 216 may be comprised of a different material 210 than the sidewall 214.

In one or more embodiments, the opening width $w_o$ of the opening 212 is less than or equal to about 50 nm, less than or equal to about 30 nm, less than or equal to about 20 nm, less than or equal to about 10 nm, or less than or equal to about 7 nm. In one or more embodiments, the opening width $w_o$ is in a range of about 8 nm to about 20 nm.

In one or more embodiments, the feature depth D of the feature 210 is greater than or equal to about 5 nm, greater than or equal to about 10 nm, greater than or equal to about 20 nm, greater than or equal to about 50 nm, greater than or equal to about 60 nm, greater than or equal to about 75 nm, greater than or equal to about 100 nm, greater than or equal to about 200 nm, greater than or equal to about 300 nm, greater than or equal to about 400 nm, or greater than or equal to about 450 nm. In one or more embodiments, the feature depth D is in a range of about 5 nm to about 500 nm.

As used herein, the term "feature" means any intentional surface irregularity. Suitable examples of features include but are not limited to trenches or vias which have a top, two sidewalls and a bottom, peaks which have a top and two sidewalls. Features can have any suitable aspect ratio (ratio of the depth of the feature to the width of the feature). In one or more embodiments, the aspect ratio of the at least one feature 210 is greater than or equal to about 5:1, 10:1, 15:1, 20:1, 25:1, 30:1, 35:1 or 40:1.

For simplicity, reference will be made to parts of the feature 210 illustrated in FIG. 2 while referring to FIGS. 3-7. For example, the device 200 shown in FIG. 3 will be referred to as having a bottom 216. For clarity of the illustrations provided, the reference numerals of the parts of feature 210 are not shown in FIGS. 3-7.

Referring to FIG. 1 and FIGS. 2-7, in one or more embodiments, the method 100 begins with optional operation 105 to pre-treat the substrate. The pre-treatment at operation 105 can be any suitable pre-treatment known to the skilled artisan. Suitable pre-treatments include, but are not limited to, pre-heating, cleaning, soaking, native oxide removal, or deposition of a contact layers (e.g., titanium silicide (TiSi)), or capping layers (e.g., TiSiN). In one or more embodiments, a layer such as titanium silicide or titanium silicon nitride (TiSiN), or other metal silicide is deposited at operation 105.

Figure 3:
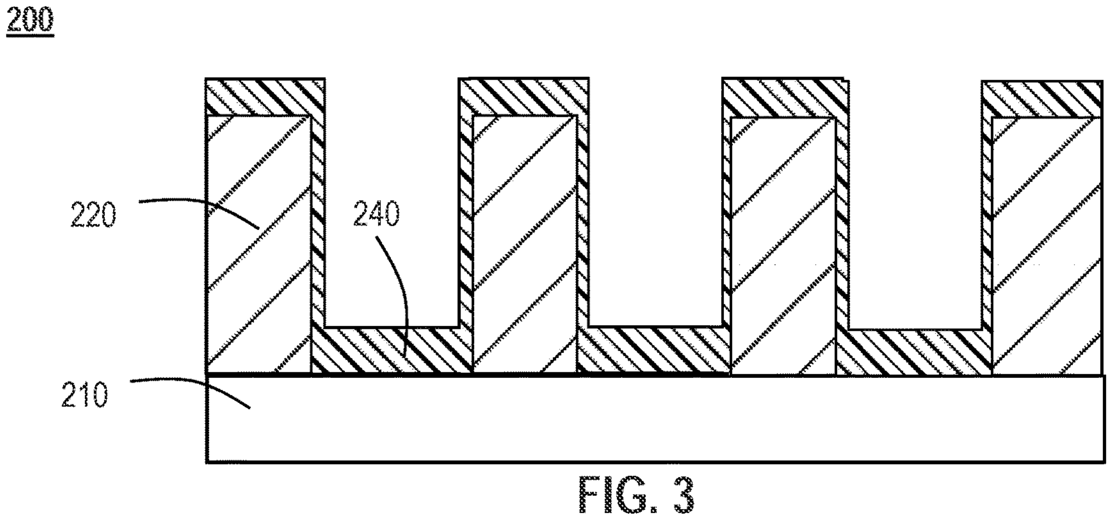
FIG. 3 illustrates a cross-sectional view of a semiconductor substrate according to one or more embodiments.

An exemplary device 200 is shown in FIG. 3 after optional operation 105. The device 200 comprises a bottom formed from substrate 210 and sidewalls and a top surface formed from layer 220. In one or more embodiments, substrate 210 comprises a conductive material and layer 220 comprises a dielectric. Those skilled in the art will recognize that the disclosed processes may be performed on different materials and/or that the illustrated layers may be arranged in different ways.

The method 100 continues with cycle 110. Cycle 110 forms a layer of metal material 240 at the bottom 216 of at least one feature 210 of the device 200. Cycle 110 includes a series of operations which are each performed in sequence and may be repeated. Some of the operations are optional within each cycle. A given optional operation may be performed during each cycle, periodically (every other, every fifth, or every hundredth cycle), as needed based on predetermined parameters, or even not at all.

As shown in FIG. 3, the cycle 110 begins with optional operation 112. At 112, a metal material 240 is deposited on the substrate surface 205 of the device 200. The metal material 240 has a bottom thickness on the bottom 216 and a top thickness on the top surface 215 and/or a sidewall thickness on the sidewall 214. The metal material may comprise any suitable material known to the skilled artisan. In one or more embodiments, the metal material 240 comprises one or more of tungsten (W), ruthenium (Ru), nickel (Ni), titanium (Ti), molybdenum (Mo), cobalt (Co), or tantalum (Ta). In some embodiments, the first metal layer 240 forms on the bottom of the at least one feature and reacts with the semiconductor substrate surface 210 to form a metal silicide. In one or more embodiments, the metal silicide comprises one or more of tungsten silicide ($WSi_x$), ruthenium silicide ($RuSi_x$), nickel silicide ($NiSi_x$), titanium silicide ($TiSi_x$), molybdenum silicide ($MoSi_x$), cobalt silicide ($CoSi_x$), or tantalum silicide ($TaSi_x$).

The metal material 240 may be deposited by any suitable method. In one or more embodiments, the metal material 240 may be deposited by physical vapor deposition (PVD). In these embodiments, as shown in FIG. 3, the sidewall thickness is less than the top thickness and the bottom thickness. In one or more embodiments, the top thickness is greater than the bottom thickness.

Those skilled in the art will recognize that the disclosed methods may begin with a metal material 240 already formed on the substrate surface 205 of the device 200, and the device is then provided. Accordingly, operation 112 is disclosed as optional. As used in this specification and the appended claims, the term "provided" means that the substrate is made available for processing (e.g., positioned in a processing chamber).

Figure 4:
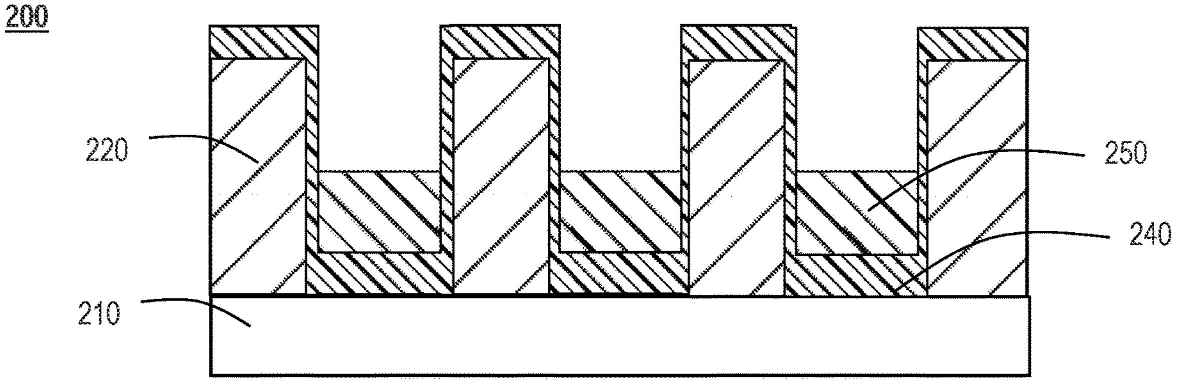
FIG. 4 illustrates a cross-sectional view of a semiconductor substrate according to one or more embodiments.

The cycle 110 continues with operation 114. As shown in FIG. 4, at operation 114, a flowable polymer film 250 is formed on the metal material 240 within the feature 210 of the device 200. The polymer film 250 has a polymer thickness less than or equal to the feature depth D. Stated differently, as a flowable film (described below), the polymer film is contained entirely with the feature 210 and is not present on the top surface 215 of the device 200. In one or more embodiments, the polymer film has a thickness in a range of about 1 nm to about 10 nm, or in a range of about 2 nm to about 5 nm. In some embodiments, the thickness of the polymer film 250 is in a range of from 1% to 99%, or in a range of from 1% to 80%, or in a range of from 2% to 20% of the depth D of the at least one feature 210.

In the disclosed methods, processing parameters and reactants may be selected to limit conformality of deposited materials, which may allow the deposited material to better fill features on the substrate. A flowable material is one which, under the proper conditions, will flow by gravity to the low point of a substrate surface and/or by capillary action to narrow CD spaces of trenches or other features.

In one or more embodiments, forming the polymer film comprises exposing the surface to one or more monomers. In one or more embodiments, the monomers comprise, consist essentially of, or consist of a single, bi-functional monomer, each functional group being different. In this way, one functional group of a monomer molecule will react with the other functional group of a different monomer molecule. Those skilled in the art may recognize this as an "A" polymer.

In one or more embodiments, the one or more monomers comprise or consist essentially of or consist of one or more of amines with bi-functional groups, aldehydes with bi-functional groups, cyanates with bi-functional groups, ketones with bi-functional groups, and alcohols with bi-functional groups.

In one or more embodiments, the amines have a formula of $H_2N—(CH_x)_n—NH_2$, where n is an integer in a range of from 1 to 20 and x is 1 or 2. In one or more embodiments, the aldehydes have a formula of $OHC—(CH_x)$ m-CHO, where m is an integer in a range of from 2 to 20 and x is 1 or 2. In one or more embodiments, the cyanates have a formula of $NCO—(CH_x)_p—OCN$, where p is an integer in a range of from 2 to 20 and x is 1 or 2. In one or more embodiments, the ketones have a formula of $ROC—(CH_x)_q—COR$, where q is an integer in a range of from 2 to 20, x is 1 or 2, and R is an alkyl group. In one or more embodiments, the alcohols have a formula of $HOC—(CH_x)_r—COH$, where q is an integer in a range of from 2 to 20 and x is 1 or 2.

In one or more embodiments, the amines, the aldehydes, the cyanates, the ketones, and the alcohols comprise carbon atoms. In one or more embodiments, the monomers described herein may be linear, branched, cyclic, saturated, or unsaturated. The monomers described herein do not contain groups which are reactive in the chemical polymerization process described herein.

In very specific embodiments, the monomers may be selected from one or more of:

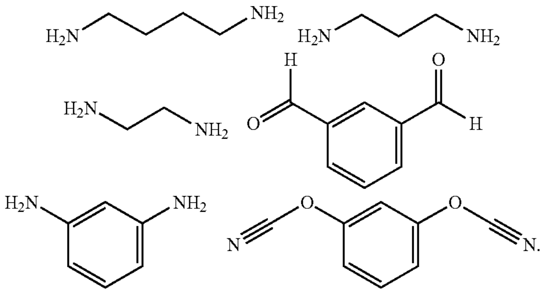

In one or more embodiments, the monomers consist essentially of two bifunctional monomers, each functional group being the same. In this way the functional groups of one monomer react with the functional groups of a second monomer. Those skilled in the art may recognize this as an "AB" polymer.

In one or more embodiments, the flexible monomers used for producing the selective protection polymer film 250 are capable of forming oligomers in a higher percentage during polymerization compared with stiff monomers. Thus, in one or more embodiments, the polymerization process is through monomer, oligomer, and polymer stages. The polymer formation depends on its local concentration of monomers. In one or more embodiments, A and B monomers are used, which can only bond between A and B, not between A's or B's. Therefore, during the purge and pumping stage, the A concentration is greatly reduced, especially on the field/wall areas 214, 215. In this case, when B monomers come in, it only forms oligomers on the field/wall areas 214, 215 with very low concentration of A monomer. Due to pumping and purge efficiency difference between field/wall 214, 215 and bottom 216 of the feature 210, the A monomer concentration in the bottom 216 of the feature 210 is higher compared with the concentration on the field/wall 214, 215. Since A monomer concentration is higher at the bottom 216 of the feature 210, it forms higher molecular number oligomer or polymer with incoming B monomers. These oligomers and polymers will continually grow with process cycles at bottom 216 of the feature 210. In one or more embodiments, a lower molecular weight B monomer is used, when it forms B-A-B oligomer on field/wall 214, 215 with low concentration of A, it is still volatile compared with higher oligomers formed at bottom 216 of the feature 210, B-A-B-A-B, etc., which decreases the amount of polymer residue on field/wall 214, 215 as much as possible.

A benzene ring has an electrical advantage to activate the aldehyde functional group during bonding with amine. When two aldehyde groups are in the 1,4 positions of a benzene ring, the monomer is a stiff or rigid monomer. When the monomer reacts with 1,4-diaminobenzene, it forms a stiff polymer with a rough surface in the feature.

Accordingly, in one or more embodiments, if two aldehyde groups are in the 1,3 positions of benzene, which is a flexible monomer, a flexible polymer film 250 with is formed. The flexible polymer film 250 has a lower glass transition temperature compared with a film formed from a stiff polymer. Thus, in one or more embodiments, a polymer film 250 is advantageously formed having a smooth polymer surface, flexibility, and a lower glass transition temperature ($T_g$), especially when the $T_g$ is below the process temperature.

In one or more embodiments, when a flexible monomer is used, the opportunity to form oligomers, such as ABAB or ABABAB, is increased. Flexible monomers also make possible a smooth surface in the feature 210 with easy packing and packing density. Flexible monomers also reduce polymer residue on field/wall 214, 215 area due to the oligomer's volatility and flowability into the feature. By this improvement, the residue of polymer on field 215 and on the sidewall 214 is eliminated, enhancing process efficiency. In one or more embodiments, the semiconductor device quality is improved when there is substantially no to no residue on the field 215 and wall 214 areas.

Without intending to be bound by theory, it is thought that the polymer that is formed and deposited as the polymer film 250 has the flexibility to fill the bottom of the feature 210. In one or more embodiments, the polymer has liquidity during deposition and further processing.

As stated previously, the polymer film 250 is flowable. In order to control the "flowability" of the resulting polymer film 250, it has been found that it is necessary to control the size of the resulting oligomers.

Accordingly, in one or more embodiments, the formation of the polymer film 250 is performed on a substrate maintained at a temperature in a range of 0° C. to 400° C. In one or more embodiments, the substrate is maintained at a temperature greater than or equal to about 0° C., greater than or equal to about 30° C., greater than or equal to about 50° C., greater than or equal to about 100° C., greater than or equal to about 200° C., or greater than or equal to about 300° C. In one or more embodiments, the substrate is maintained at a temperature less than or equal to about 400° C., less than or equal to about 300° C., less than or equal to about 200° C., less than or equal to about 100° C., less than or equal to about 50° C., or less than or equal to about 30° C.

Further, other process parameters may be controlled during the formation of the polymer film 250. Examples of parameters which may be controlled include, but are not limited to processing chamber pressure, monomer selections, the use of an inert diluent or carrier gas, partial pressures of monomers, pulse sequence of monomers, and pause periods to permit flow of the polymer material.

Figure 5:
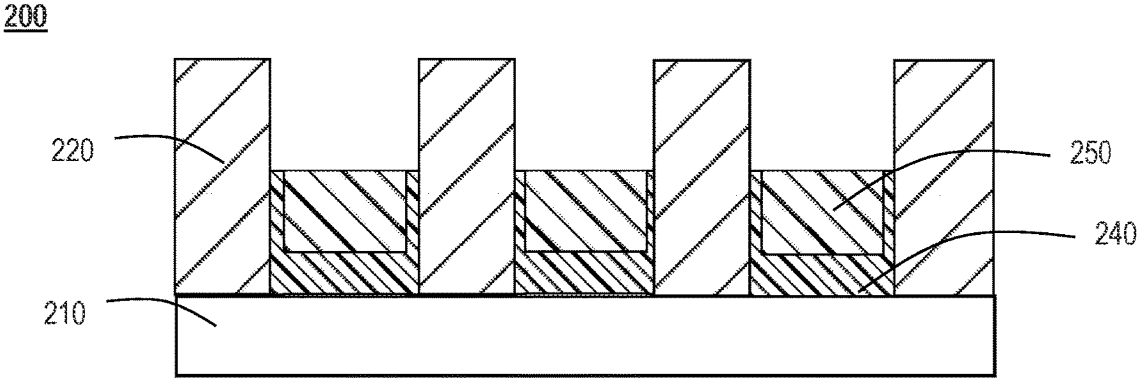
FIG. 5 illustrates a cross-sectional view of a semiconductor substrate according to one or more embodiments.

The cycle 110 continues with operation 116. As shown in FIG. 5, at 116, at least a portion of the metal material 240 is selectively removed. The metal material 240 is removed from the top surface 215 without substantially affecting any material beneath the polymer film. As used in this regard, a process which does not "substantially affect" material layers does not cause any decrease in volume, thickness, or composition. One skilled in the art will recognize that the polymer film 250 is acting as an etch stop layer during the removal of a portion of the metal material 240.

In one or more embodiments, operation 116 also removes a portion of the metal material 240 from the sidewall 214. In one or more embodiments, any metal material 240 which is present on sidewall 214 below the upper surface of the polymer film 250 may remain intact without being removed.

In one or more embodiments, the selective removal of the metal material 240 is performed by exposing the substrate surface 205 of device 200 to $NF_3$ radicals. In one or more embodiments, the selective removal of the metal material 240 is performed by exposing the substrate surface 205 to a fluorine-based plasma or a chlorine-based plasma. In one or more embodiments, the substrate is maintained at a temperature in a range of 80° C. to 150° C.

In one or more embodiments, the selective removal of metal material 240 is performed by a sequence of oxidizing metal material 240 and exposing the oxidized material to a metal halide to etch the oxidized material. In one or more embodiments, when the metal material comprises tungsten, the metal halide comprises $WCl_5$.

The cycle 110 continues with optional operation 118. As shown in FIG. 6, at 118, the polymer film 250 is removed to expose the metal material 240 beneath the polymer film 250. In one or more embodiments, the removal of the polymer film 250 is complete and leaves substantially no or no residue.

In one or more embodiments, the polymer film 250 is removed by exposing the substrate surface 205 of the device 200 to a hydrogen ($H_2$) plasma treatment. In one or more embodiments, the polymer film 250 is removed by exposure to a thermal $O_2$ environment at an elevated temperature.

In one or more embodiments, the removal of the polymer film 250 is performed by exposing the substrate surface 205 of device 200 to one or more of a thermal process or a hydrogen ($H_2$) plasma treatment. In one or more embodiments, after removing the metal material 240 from the top surface 215 and sidewall 214, the polymer can be removed thermally by heating it to 350° C. to 500° C. under vacuum. In other embodiments, after removing the metal material 240 from the top surface 215 and sidewall 214, the polymer may also be removed by hydrogen ($H_2$) plasma at temperature in a range of from 100° C. to 300° C. for a time period in a range of from 2 s to 30 s.

The cycle 110 continues with optional operation 119. At 119, unillustrated, the substrate surface 105 may be optionally cleaned. The cleaning process can be any suitable process which cleans the surface of the metal material. In one or more embodiments, the cleaning process does not oxidize the metal surface.

In one or more embodiments, at the end of cycle 110, the surface of the metal material 240 does not contain any contaminants or residues of the polymer layer 240. Specifically, in one or more embodiments, there are no carbon or oxygen residues on the surface of the metal material 240. In one or more embodiments, when the method 100 includes repeated cycles 110 (see below), there are no contaminants or residues between amounts of the metal material 240 deposited in subsequent cycles. In one or more embodiments, when the method 100 includes the deposition of a second metal material 260 (see below), there are no contaminants or residues between the metal material 240 are the second metal material 260.

In one or more embodiments, this is achieved by a removal process at operation 118 which leaves no residues or contaminants. In one or more embodiments, this is achieved by performing a clean process at operation 119. In one or more embodiments, the monomers are selected so as not to contain any oxygen atoms which may oxidize the surface of the metal material 240 during removal of the polymer layer 250.

The method 100 continues to decision point 120. At point 120, the substrate is evaluated to determine whether or not the metal material 240 has reached a predetermined thickness or a predetermined number of cycles 110 have been performed. If the conditions are met, the method 100 continues to operation 130. If the conditions are not met, the method 100 returns to the beginning of cycle 110 with operation 112. In those embodiments in which the cycle 110 is repeated to form additional material, those skilled in the art will appreciate that operation 112 is often performed to deposit the requisite additional metal material. In one or more embodiments, the predetermined thickness is in a range of about 2 nm to about 10 nm.

The method 100 continues with optional operation 130. At 130, unillustrated, the metal material 240 may be optionally etched. In one or more embodiments, the metal material 240 is etched to remove the portions of the metal material 240 which extend up the sidewall 214. When etched, the metal material 240 is also thinned on the bottom 216 of the feature 210. Accordingly, one skilled in the art will recognize that the metal material 240 may be deposited to a greater bottom thickness than desired in a final product to provide for sacrificial material which will be removed when etching the metal material from the sidewall 214.

The method 100 continues at optional operation 140. As shown in FIG. 7, at 140, a second metal material 260 is selectively deposited on the metal material 240. The deposition process is selective to the surface of the metal material 240 over other substrate surface materials (e.g., layer 220). The selective deposition process provides a gapfill material comprising the second metal material 260 which is formed in a bottom-up fashion without lateral deposition from the sidewall 214. In one or more embodiments, the second metal material is deposited without forming any voids or seams within the second metal material 260.

In one or more embodiments, the metal material 240 and the second metal material 260 comprise the same metal. In one or more embodiments, the metal material 240 and the second metal material 260 comprise different metals. In one or more embodiments, the first metal material 240 comprises or consists essentially of tungsten (W), molybdenum (Mo), ruthenium (Ru), cobalt (Co), nickel (Ni), titanium (Ti), and tantalum (Ta).

The method may end after operation 140 or it may continue with optional post processing at optional operation 150. The optional post-processing operation 150 can be, for example, a process to modify film properties (e.g., annealing or plasma treatment), a further film deposition process (e.g., additional ALD or CVD processes) to grow additional films, or a further etch process to form a desired predetermined device architecture. In one or more embodiments, the optional post-processing operation 150 can be a process that modifies a property of the deposited film. In one or more embodiments, the optional post-processing operation 150 comprises annealing the device 200. In one or more embodiments, annealing is performed at a temperature greater than or equal to about 300° C., greater than or equal to about 400° C., greater than or equal to about 500° C., greater than or equal to about 600° C., greater than or equal to about 700° C., greater than or equal to about 800° C., greater than or equal to about 900° C. or greater than or equal to about 1000° C. The annealing environment of one or more embodiments comprises one or more of an inert gas (e.g., molecular nitrogen ($N_2$), argon (Ar)) or a reducing gas (e.g., molecular hydrogen ($H_2$) or ammonia ($NH_3$)) or an oxidant, such as, but not limited to, oxygen ($O_2$), ozone ($O_3$), or peroxides. Annealing can be performed for any suitable length of time. In one or more embodiments, the substrate is annealed for a predetermined time in the range of about 15 seconds to about 90 minutes, or in the range of about 1 minute to about 60 minutes.

FIG. 8 illustrates a schematic top-view diagram of an example of a multi-chamber processing system 400 according to embodiments of the present disclosure. The processing system 400 generally includes a factory interface 402, load lock chambers 404, 406, transfer chambers 408, 410 with respective transfer robots 412, 414, holding chambers 416, 418, and processing chambers 420, 422, 424, 426, 428, 430. As detailed herein, wafers in the processing system 400 can be processed in and transferred between the various chambers without exposing the wafers to an ambient environment exterior to the processing system 400 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 400. Accordingly, the processing system 400 may provide an integrated solution for some processing of wafers.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 8, the factory interface 402 includes a docking station 440 and factory interface robots 442 to facilitate transfer of wafers. The docking station 440 is configured to accept one or more front opening unified pods (FOUPs) 444. In some examples, each factory interface robot 442 generally comprises a blade 448 disposed on one end of the respective factory interface robot 442 configured to transfer the wafers from the factory interface 402 to the load lock chambers 404, 406.

The load lock chambers 404, 406 have respective ports 450, 452 coupled to the factory interface 402 and respective ports 454, 456 coupled to the transfer chamber 408. The transfer chamber 408 further has respective ports 458, 460 coupled to the holding chambers 416, 418 and respective ports 462, 464 coupled to processing chambers 420, 422. Similarly, the transfer chamber 410 has respective ports 466, 468 coupled to the holding chambers 416, 418 and respective ports 470, 472, 474, 476 coupled to processing chambers 424, 426, 428, 430. The ports 454, 456, 458, 460, 462, 464, 466, 468, 470, 472, 474, 476 can be, for example, slit valve openings with slit valves for passing wafers therethrough by the transfer robots 412, 414 and for providing a seal between respective chambers to prevent a gas from passing between the respective chambers. Generally, any port is open for transferring a wafer therethrough. Otherwise, the port is closed.

The load lock chambers 404, 406, transfer chambers 408, 410, holding chambers 416, 418, and processing chambers 420, 422, 424, 426, 428, 430 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 442 transfers a wafer from a FOUP 444 through a port 450 or 452 to a load lock chamber 404 or 406. The gas and pressure control system then pumps down the load lock chamber 404 or 406. The gas and pressure control system further maintains the transfer chambers 408, 410 and holding chambers 416, 418 with an interior low pressure or vacuum environment (which may include an inert gas). Hence, the pumping down of the load lock chamber 404 or 406 facilitates passing the wafer between, for example, the atmospheric environment of the factory interface 402 and the low pressure or vacuum environment of the transfer chamber 408.

With the wafer in the load lock chamber 404 or 406 that has been pumped down, the transfer robot 412 transfers the wafer from the load lock chamber 404 or 406 into the transfer chamber 408 through the port 454 or 456. The transfer robot 412 is then capable of transferring the wafer to and/or between any of the processing chambers 420, 422 through the respective ports 462, 464 for processing and the holding chambers 416, 418 through the respective ports 458, 460 for holding to await further transfer. Similarly, the transfer robot 414 is capable of accessing the wafer in the holding chamber 416 or 418 through the port 466 or 468 and is capable of transferring the wafer to and/or between any of the processing chambers 424, 426, 428, 430 through the respective ports 470, 472, 474, 476 for processing and the holding chambers 416, 418 through the respective ports 466, 468 for holding to await further transfer. The transfer and holding of the wafer within and among the various chambers can be in the low pressure or vacuum environment provided by the gas and pressure control system.

The processing chambers 420, 422, 424, 426, 428, 430 can be any appropriate chamber for processing a wafer. In some embodiments, the processing chamber 420 can be capable of performing an annealing process, the processing chamber 422 can be capable of performing a cleaning process, and the processing chambers 424, 426, 428, 430 can be capable of performing epitaxial growth processes. In some examples, the processing chamber 422 can be capable of performing a cleaning process, the processing chamber 420 can be capable of performing an etch process, and the processing chambers 424, 426, 428, 430 can be capable of performing respective epitaxial growth processes. The processing chamber 422 may be a SiCoNi™ Preclean chamber available from Applied Materials of Santa Clara, Calif. The processing chamber 420 may be a Selectra™ Etch chamber available from Applied Materials of Santa Clara, Calif.

A system controller 490 is coupled to the processing system 400 for controlling the processing system 400 or components thereof. For example, the system controller 490 may control the operation of the processing system 400 using a direct control of the chambers 404, 406, 408, 416, 418, 410, 420, 422, 424, 426, 428, 430 of the processing system 400 or by controlling controllers associated with the chambers 404, 406, 408, 416, 418, 410, 420, 422, 424, 426, 428, 430. In operation, the system controller 490 enables data collection and feedback from the respective chambers to coordinate performance of the processing system 400.

The system controller 490 generally includes a central processing unit (CPU) 492, memory 494, and support circuits 496. The CPU 492 may be one of any form of a general-purpose processor that can be used in an industrial setting. The memory 494, or non-transitory computer-readable medium, is accessible by the CPU 492 and may be one or more of memory such as random-access memory (RAM), read only memory (ROM), floppy disk, hard disk, or any other form of digital storage, local or remote. The support circuits 496 are coupled to the CPU 492 and may comprise cache, clock circuits, input/output subsystems, power supplies, and the like. The various methods disclosed herein may generally be implemented under the control of the CPU 492 by the CPU 492 executing computer instruction code stored in the memory 494 (or in memory of a particular process chamber) as, for example, a software routine. When the computer instruction code is executed by the CPU 492, the CPU 492 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 408, 410 and the holding chambers 416, 418. In other examples, more or fewer transfer chambers (e.g., one transfer chamber) and/or more or fewer holding chambers (e.g., no holding chambers) may be implemented as a transfer apparatus in a processing system.

Processes may generally be stored in the memory of the system controller 1190 as a software routine that, when executed by the processor, causes the process chamber to perform processes of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

Embodiments of the disclosure are directed to a non-transitory computer readable medium. In one or more embodiments, the non-transitory computer readable medium includes instructions that, when executed by a controller of a processing chamber, causes a processing chamber to perform the operations of any of the methods (e.g., method 100) described herein. In one or more embodiments, the controller causes a processing chamber to perform the operations of method 100. In one or more embodiments, the controller causes the processing chamber to perform the operations of forming a polymer film on the substrate surface (operation 114). In one or more embodiments, the controller causes the processing chamber to perform the operations of removing the metal material (operation 116).

Spatially relative terms, such as "beneath," "below." "lower," "above." "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a semiconductor device, the method comprising:

depositing a first metal layer by physical vapor deposition (PVD) on a semiconductor substrate surface with at least one feature formed thereon, the at least one feature having at least one opening having a width, at least one sidewall, and a bottom, the at least one feature extending a feature depth from a top surface to the bottom, the first metal layer forming on the top surface, on the at least one sidewall, and on the bottom;

exposing the semiconductor substrate surface to one or more monomers to form a flowable polymer film on the first metal layer within the at least one feature, the flowable polymer film forming on the first metal layer on the bottom, the one or more monomers selected from one or more of amines with bi-functional groups, aldehydes with bi-functional groups, cyanates with bi-functional groups, ketones with bi-functional groups, and alcohols with bi-functional groups;

selectively removing at least a portion of the first metal layer from the top surface and the at least one sidewall; and removing the flowable polymer film to expose the first metal layer on the bottom of the at least one feature.

2. The method of claim 1, wherein the first metal layer comprises one or more of tungsten (W), molybdenum (Mo), ruthenium (Ru), cobalt (Co), nickel (Ni), titanium (Ti), and tantalum (Ta).

3. The method of claim 2, wherein the first metal layer formed on the bottom of the at least one feature reacts with the semiconductor substrate surface to form a metal silicide.

4. The method of claim 3, wherein the metal silicide comprises one or more of tungsten silicide ($WSi_x$), ruthenium silicide ($RuSi_x$), nickel silicide ($NiSi_x$), titanium silicide ($TiSi_x$), molybdenum silicide ($MoSi_x$), cobalt silicide ($CoSi_x$), or tantalum silicide ($TaSi_x$).

5. The method of claim 1, further comprising selectively depositing a second metal layer on the first metal layer to fill the at least one feature.

6. The method of claim 5, wherein the second metal layer comprises one or more of tungsten (W), molybdenum (Mo), ruthenium (Ru), cobalt (Co), nickel (Ni), titanium (Ti), or tantalum (Ta).

7. The method of claim 5, wherein the first metal layer and the second metal layer are the same.

8. The method of claim 1, the semiconductor substrate surface is exposed to the one or more monomers at a temperature in a range of from 30° C. to 400° C.

9. The method of claim 1, wherein the amines have a formula of $H_2N—(CH_x)_n—NH_2$, where n is an integer in a range of from 1 to 20 and x is 1 or 2.

10. The method of claim 1, wherein the aldehydes have a formula of $OHC—(CH_x)_m—CHO$, where m is an integer in a range of from 2 to 20 and x is 1 or 2.

11. The method of claim 1, wherein the cyanates have a formula of $NCO—(CH_x)_p—OCN$, where p is an integer in a range of from 2 to 20 and x is 1 or 2.

12. The method of claim 1, wherein the flowable polymer film has a flexibility suitable for filling the bottom of the at least one feature.

13. The method of claim 1, the portion of the first metal layer is selectively removed at a temperature in a range of from 100° C. to 400° C.

14. The method of claim 13, wherein selectively removing the portion of the first metal layer comprises exposing the semiconductor substrate surface to a fluorine-based plasma or a chlorine-based plasma.

15. The method of claim 1, wherein removing the flowable polymer film comprises exposing the semiconductor substrate surface to one or more of a thermal process or a hydrogen ($H_2$) plasma treatment.

16. The method of claim 1, comprising repeating the operations of: forming a flowable polymer film on the first metal layer, selectively removing at least a portion of the first metal layer from the top surface and the at least one sidewall, and removing the flowable polymer film.

17. The method of claim 1, wherein the feature depth is in a range of about 5 nm to about 500 nm.

18. The method of claim 1, wherein the polymer has a thickness less than or equal to the feature depth.

19. The method of claim 18, wherein the thickness is in a range of about 1% to about 99% of the feature depth.

20. A method of forming a semiconductor device, the method comprising:

depositing a first metal layer on a substrate surface with at least one feature formed thereon, the at least one feature including at least one opening, at least one sidewall, and a bottom, the at least one feature extending a feature depth from a top surface to the bottom, the first metal layer forming on the top surface, on the at least one sidewall, and on the bottom;

exposing the substrate surface to one or more monomers to form a flowable polymer film on the first metal layer within the at least one feature, the flowable polymer film forming on the first metal layer on the bottom, the one or more monomers selected from one or more of amines with bi-functional groups, aldehydes with bi-functional groups, cyanates with bi-functional groups, ketones with bi-functional groups, and alcohols with bi-functional groups;

selectively removing the first metal layer from the top surface and from the at least one sidewall;

removing the flowable polymer film to expose the first metal layer on the bottom of the at least one feature; and selectively depositing a second metal layer on the first metal layer to fill the at least one feature.

* * * * *